United States Patent [19]

Kaneko et al.

[11] Patent Number: 5,223,113

[45] Date of Patent: Jun. 29, 1993

[54] APPARATUS FOR FORMING REDUCED PRESSURE AND FOR PROCESSING OBJECT

[75] Inventors: Satoshi Kaneko, Yokohama; Taichi Fugita, Yamato; Toshihisa Nozawa, Yokohama; Yoichi Ueda, Yokohama; Yukimasa Yoshida, Yokohama; Isahiro Hasegawa, Zushi; Haruo Okano, Tokyo, all of Japan

[73] Assignees: Tokyo Electron Limited, Tokyo; Kabushiki Kaisha Toshiba, Kawasaki, both of Japan

[21] Appl. No.: 732,240

[22] Filed: Jul. 18, 1991

[30] Foreign Application Priority Data

Jul. 20, 1990 [JP] Japan .................................. 2-192467
Jul. 20, 1990 [JP] Japan .................................. 2-192468

[51] Int. Cl.⁵ .............................................. C23F 1/02
[52] U.S. Cl. .............................. 204/298.33; 156/345; 204/298.09; 204/298.15; 204/298.34
[58] Field of Search ....................... 204/192.32, 298.07, 204/298.09, 298.15, 298.31, 298.33, 298.34; 156/345

[56] References Cited

U.S. PATENT DOCUMENTS

| | | | |
|---|---|---|---|
| 4,473,437 | 9/1984 | Higashikawa et al. | 204/298.31 X |
| 4,491,496 | 1/1985 | Laporte et al. | 204/298.31 X |
| 4,816,638 | 3/1989 | Ukai et al. | 204/298.35 X |
| 4,817,558 | 4/1989 | Itoh | 118/725 |
| 4,838,978 | 6/1989 | Sekine et al. | 204/298.35 X |
| 4,878,995 | 11/1989 | Arikado et al. | 204/298.31 X |
| 4,886,565 | 12/1989 | Koshiba et al. | 204/298.35 X |
| 4,931,135 | 6/1990 | Horiuchi et al. | 156/345 X |
| 4,943,361 | 7/1990 | Kakehi eet al. | 204/298.31 X |
| 5,078,851 | 1/1992 | Nishihata et al. | 204/298.31 X |
| 5,085,750 | 2/1992 | Soraoka et al. | 156/345 X |

*Primary Examiner*—Nam X. Nguyen
*Attorney, Agent, or Firm*—Oblon, Spivak, McClelland, Maier & Neustadt

[57] ABSTRACT

A semiconductor wafers processing apparatus comprises a susceptor for mounting and fixing a wafer thereon, a cooling jacket for cooling the susceptor, a process chamber whose wall encloses the susceptor and the cooling jacket, an O-ring for shielding from process atmosphere in the process chamber a clearance formed between an inner cylinder of the process chamber wall and the outer circumferences of the susceptor and the cooling jacket, and an exhaust pump for exhausting gas in the clearance. It further comprises load lock chambers for carrying the wafer into and out of the process chamber, and heat insulating members interposed between those faces of the process chamber and each of the load lock chambers which are opposed to each other. The process chamber wall can be heat-insulated from the susceptor and the cooling jacket by the exhausted clearance and the process chamber can be heat-insulated from each of the load lock chambers by the heat insulating members.

13 Claims, 4 Drawing Sheets

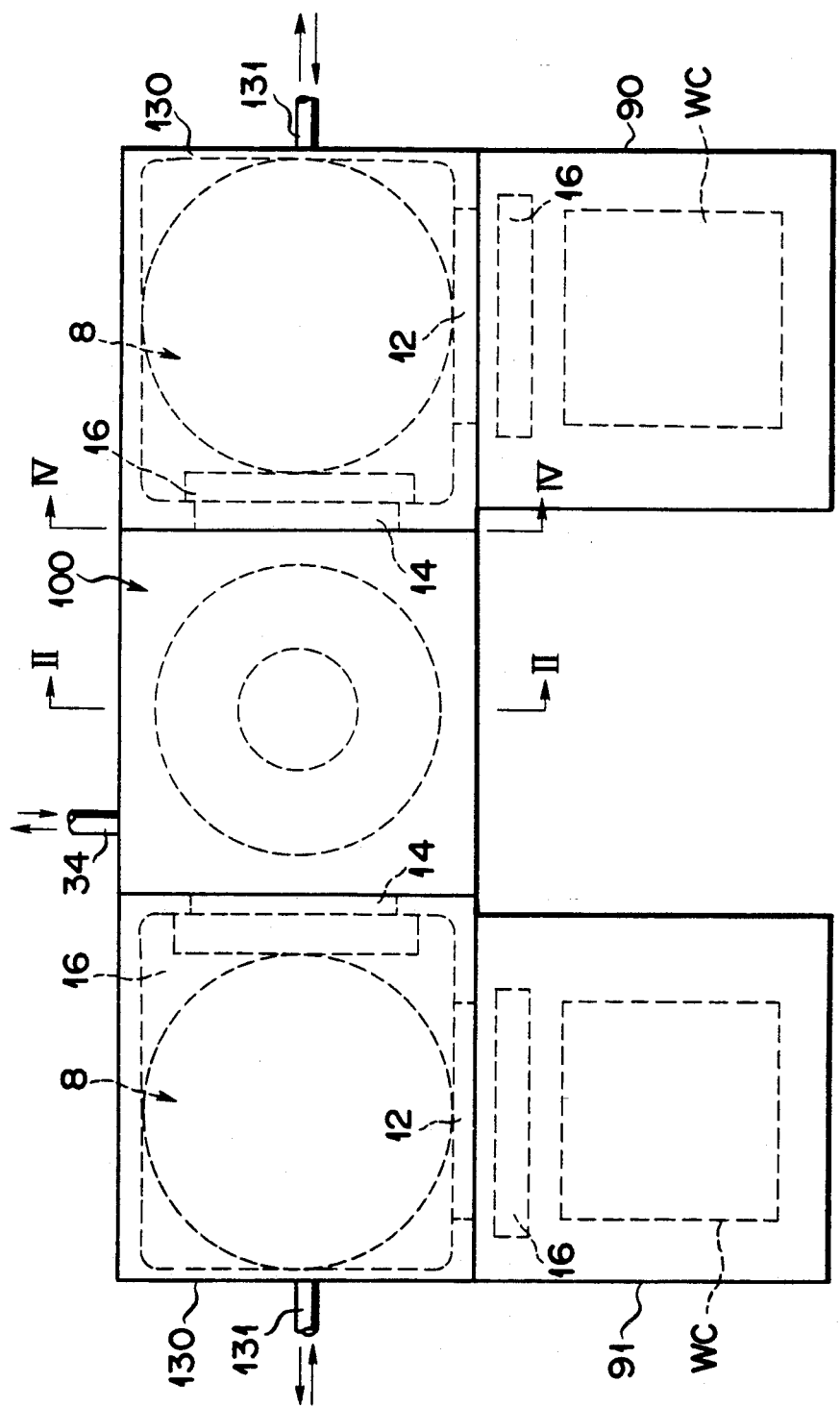
F I G. 1

APPARATUS FOR FORMING REDUCED PRESSURE AND FOR PROCESSING OBJECT

BACKGROUND OF THE INVENTION

1. Field of the Invention

The present invention relates to an apparatus for forming reduced pressure and for processing an object. More particularly, it relates to a heat insulating structure in the process chamber of the magnetron plasma etching apparatus and a heat insulating structure provided between the process chamber and a load lock chamber.

2. Description of the Related Art

Various kinds of apparatus have been proposed to apply various kinds of process to semiconductor wafers in a vacuum chamber. Particularly in the course of manufacturing semiconductors, the semiconductor wafers are subject to various kinds of thermal influence at the etching, ashing and film-forming processes.

In the case of the plasma etching apparatus, for example, plasma of high temperature is generated because of the anisotropic etching conducted and various kinds of thermal damage are added to the semiconductor wafers because of the radiation heat of the plasma. In order to solve this, a susceptor is cooled by a lower cooling jacket to indirectly cool the semiconductor wafer. The susceptor is exposed, in this case, to process atmosphere in the chamber only at the top (on which the wafer is mounted) thereof but not at the other areas (or side and underside) thereof. In addition, the outer circumferences of the susceptor and the cooling jacket are located in the process chamber and the underside of the cooling section is connected to the process chamber with air interposed between them.

The chamber which encloses the outer circumferences of the susceptor and the cooling section is opposed to them with an insulating matter such as ceramics interposed between them and in the case of the plasma etching of the RIE type, the susceptor is used as an RF cathode and the wall of the chamber is grounded. No attention is paid to heat transmission between the susceptor/cooling section and the chamber wall in this case. The amount of heat entered from the chamber wall into the cooling section is thus made large. This causes the wafer to be insufficiently cooled, and the temperature of the chamber wall to be lowered to a great extent.

When the temperature of the chamber wall is lowered, various kinds of fliers caused during the plasma etching process adhere to the inner wall of the chamber, which is thus contaminated. When the inner wall of the chamber is contaminated in this manner, the fliers adhered are scattered from the inner wall of the chamber was into the air in the chamber to adhere to the wafer, thereby causing the capacity of processing the wafers in the chamber to be lowered. In addition, maintaining care must be often added to the process chamber.

The temperature to which the wafers are cooled is now set to be in a range of $-60°$ C. to $-100°$ C., but as the temperature at which the wafers are processed becomes lower and lower, it will be thought to reach $-150°$ C. This will cause the inner wall of the process chamber to be more often contaminated in the future.

In order to prevent the inner wall of the process chamber from being contaminated, therefore, a heater is embedded in the wall of the process chamber to positively heat the wall.

In the case of the pressure-reduced processing apparatus of this kind, however, load lock chambers are located adjacent to the process chamber. Each of the load lock chambers is communicated with an exhaust means, which allows pressure in the load lock chamber to be reduced to the internal pressure in the process chamber for a short period. When the wafer is carried into and out of the process chamber via the load lock chambers, dust and particles can be prevented from entering into the process chamber.

The process and load lock chambers are usually made of metal such as aluminum and they are bolt-fixed to each other with their metal faces contacted at such a position that their gates are opposed to each other. This causes the amount of heat transmitted from the process chamber wall to the load lock chamber wall to become large. In other wards, the heat capacity of the process chamber wall becomes large. It therefore needs quite a large heating power and a long time to heat the process chamber to a predetermined temperature.

In addition, temperature control for keeping the process chamber wall at the predetermined temperature is quite difficult.

Further, each of the load lock chamber is provided with a handling system (having robot) arms for carrying the wafer into and out of the process chamber and as the temperature of the load lock chamber is raised higher and higher by heat transmitted from the process chamber, the drive section of the handling system is worn more and more. The amount of dust thus created in the load lock chamber becomes unnegligible, thereby lowering the capacity of processing the semiconductor wafers in the process chamber because of dust adhering to the wafers. In addition, the life of the handling system becomes shorter as the drive section thereof is worn more and more.

SUMMARY OF THE INVENTION

An object of the present invention is to provide an apparatus capable of reducing the thermal interaction of the wafer and the wall of the process chamber is heated to prevent flier adhering to the inner wall.

Another object of the present invention is to provide a semiconductor wafers processing apparatus capable of reducing the thermal interaction of the process chamber and the load lock chambers.

According to an aspect of the present invention, there can be provided an apparatus comprising, a susceptor for mounting and holding an object thereon, a temperature control section for controlling the temperature of the susceptor, a process chamber whose wall encloses the susceptor and the temperature control section, seal means for shielding from process atmosphere in the process chamber a clearance formed between a part of the process chamber wall and the outer circumferences of the susceptor and the temperature control section, and exhausting means for exhausting gas in said clearance, wherein the wall of the process chamber becomes adiabatic from the susceptor and the temperature control section by the exhausted clearance.

According to another aspect of the present invention, there can be provided an apparatus comprising, a process chamber having a cooling section, for processing an object while keeping its wall heated, an adjacent chamber for loading/unloading the object from/to the process chamber, athermalizing means for athermalizing between said process chamber wall and said cooling section, and an insulating member interposed between the process chamber and the adjacent chamber at their opposed faces.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a layout showing the whole of the magnetron plasma etching system according to an embodiment of the present invention;

DETAILED DESCRIPTION OF THE PREFERRED EMBODIMENTS

Figure 2:
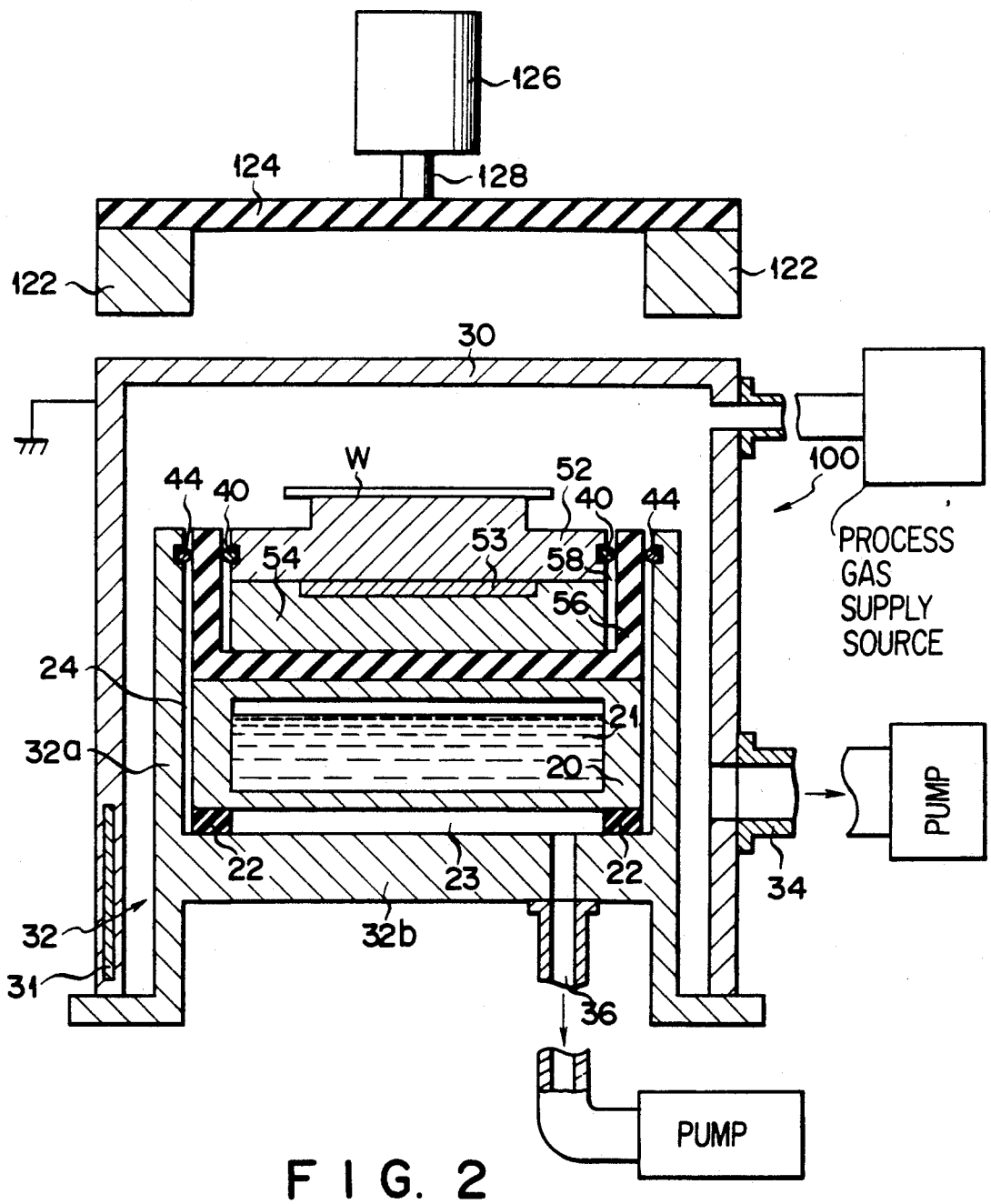
FIG. 2 is a vertically-sectioned view showing a process chamber in the magnetron plasma etching system.

An embodiment of the magnetron plasma etching system to which the present invention is applied will be described with reference to the accompanying drawings.

As shown in FIG. 1, the magnetron plasma etching system comprises a process chamber 100, two load lock chambers 130 and two wafer cassette waiting sections (or loading/unloading sections) 90 and 91. The process chamber 100 is located between the two load lock chambers 130. Each of those partition walls which partition the process chamber 100 from the load lock chambers 130 is provided with an opening 14, which is hermetically shielded by a gate block 16.

The loading section 90 is located adjacent to one of the load lock chambers 130 and the unloading section 91 is located adjacent to the other thereof. A wafer cassette WC is carried into and out of each of the loading 90 and the unloading section 91 by means of a robot (not shown). Each of those partition walls which partition the load lock chambers 130 from the loading 90 and the unloading section 91 is provided with an opening 12, which is hermetically shielded by a gate block 16. Each of the wafer cassettes WC includes therein 25 sheets of silicon wafers W.

Each of the first and second load lock chambers 130 is provided with a handling device 8, by which a silicon wafer W is carried into or out of the process chamber 100. Each of the load lock chambers 130 is provided with an exhaust pipe 131, which is communicated with the load lock chamber 130 at one end thereof and with the sucking opening of an exhaust pump (not shown) at the other end thereof.

As shown in FIG. 2, an etching apparatus of the RIE type is housed in the process chamber 100. The process chamber 100 has a housing comprising upper and lower frames 30 and 32. Susceptors 52 and 54 insulated from around by an insulation frame 56 are arranged on the lower frame 32. The upper frame 30 is earthed and when current is supplied from an RF power source (not shown) to the function (or lower) susceptor 54, the lower susceptor 54 serves as an electrode opposed to the upper frame 30.

The silicon wafer W is mounted and held on the top of the upper susceptor 52 by the electrostatic chuck system, for example. The upper susceptor 52 is fixed detachable from the lower susceptor 54 and the reason why the upper susceptor 52 is fixed in this manner resides in that the lower susceptor 54 connected to the RF power source is made free from maintenance and that only the upper susceptor 52 contaminated is made exchangeable with a new one. A heater 53 is embodied in the lower susceptor 54. This heater 53 is used to microadjust the temperature of the wafer W mounted on the susceptor 52. Another heater 31 is embedded in the lower portion of the upper outer frame 30 of the process chamber 100 to heat the upper outer frame 30. The outer frame 30 is made of aluminium plate and like.

Circumferences of the upper 52 and the lower susceptor 54 and the underside of the lower susceptor 54 are covered or hidden by the insulation frame 56 and only the top of the upper susceptor 52 is exposed to process atmosphere. An O-ring 40 is interposed between the upper susceptor 52 and the insulation frame 56 to form a first clearance 58 between them. Outer circumferences of the upper and lower susceptors 52 and 54 and the inner circumference of the insulation frame 56 are mirror-finished. The first clearance 58 is kept high in vacuum.

A cooling jacket 20 is located just under the insulation frame 56. Liquid nitrogen is contained in the cooling jacket 20. The inner bottom wall of the cooling jacket 20 is formed porous to carry out nucleate boiling at the bottom of the jacket 20, so that the liquid nitrogen in the jacket 20 can be kept $-196°$ C. The wafer W on the susceptor 52 can be controlled to a temperature lower that $-60°$ C. during its process by the cooling jacket 20 and the heater 53.

Plural insulating members 22 are interposed between the cooling jacket 20 and a bottom 32b of the lower frame 32 to form a second clearance 23 between them. An inner cylinder 32a extends upward from the bottom 32b of the lower frame 32 and the cooling jacket 20 and the insulation frame 56 are shielded from the process atmosphere by the inner cylinder 32a of the lower frame 32.

An O-ring 44 is inserted between the insulation frame 56 and the inner cylinder 32a of the lower frame 32 to form a third clearance 24 between them. The outer circumference of the insulation frame 56 and the inner circumference of the inner cylinder 32a are mirrorfinished. The O-rings 40 and 44 are made of resin of the fluorine group such as teflon.

Figure 3:
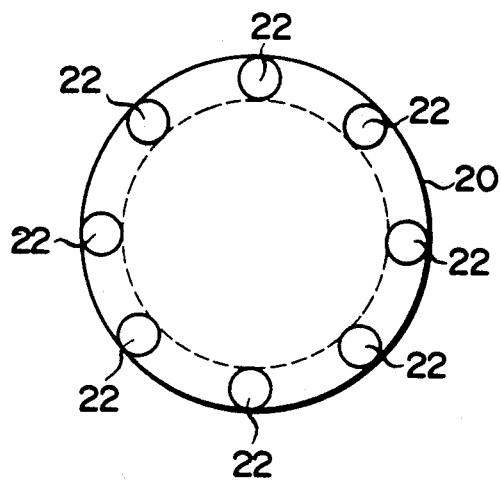
FIG. 3 is a plan showing the underside of a cooling jacket.

As shown in FIG. 3, the plural insulating members 22 for supporting the cooling jacket 20 are separated from one another. The second and third clearances 23 and 24 are therefore communicated with each other. It is more preferable to keep the third clearance 24 as small as possible unless any of the insulation frame 56 and the cooling jacket 20 is closely contacted with the inner cylinder 32a of the lower frame 32.

As shown in FIG. 2, the space filled with the process atmosphere and enclosed by the frames 30 and 32 is exhausted vacuum through a first exhaust pipe 34. The second and third clearances 23 and 24 are exhausted vacuum through a second exhaust pipe 36.

A disk 124 provided with a permanent magnet 122 on the underside thereof is located in opposite to the wafer W on the susceptor 52 and above the upper frame 30. A shaft 128 for a motor 126 is attached to the top of the disk 124. When the permanent magnet 122 attached to the disk 124 is rotated by the motor 126, magnetic field is formed adjacent to the wafer W and parallel to the face of the wafer W.

Etching gas in the process chamber 100 is exhausted through the exhaust pipe 34, thereby causing internal pressure in the process chamber 100 to be reduced to a range of $10^{-2}$–$10^{-3}$ Torr. The etching gas is made plasma between the opposed electrodes. In the case of the magnetron plasma etching, electrons make cycloidal movement due to the interaction of the magnetic field and the electric field of a plasma sheath perpendicular to the magnetic field, so that the times at which electrons collide with particles to ionize them can be increased. Even when the internal pressure in the process chamber 100 is so low as described above, therefore, high etching speed can be obtained.

Figure 4:
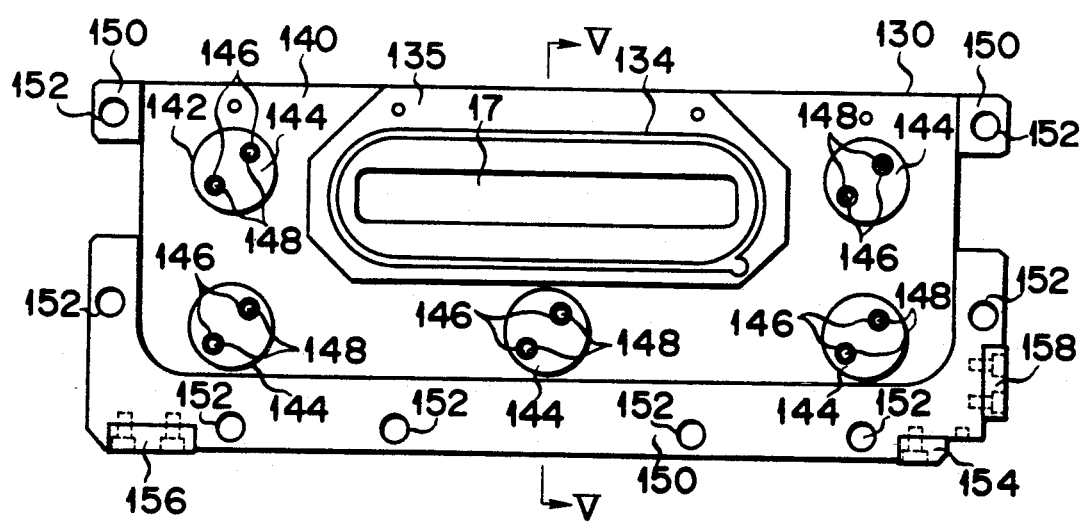
FIG. 4 is a plan showing that face of a load lock chamber which is connected to the process chamber.
Figure 5:
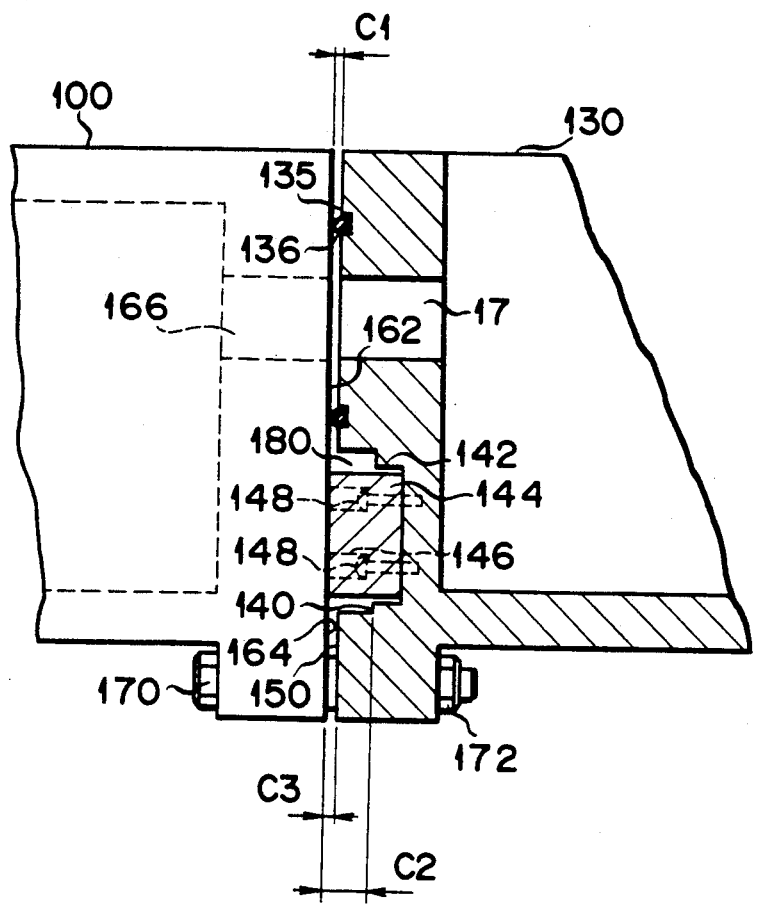
FIG. 5 is a partially-sectioned view showing that portion of the load lock chamber which is connected to the process chamber.

Referring to FIGS. 4 and 5, that portion of the process chamber 100 which is connected to the load lock chamber 130 will be described. FIG. 4 is a plan showing that face of the load lock chamber 130 to which the process chamber 100 is connected, and FIG. 5 is a sectional view taken along a line V—V in FIG. 4 and showing the process and load lock chambers 100 and 130 connected to each other.

A gate 17 is made open at the connecting face of the load lock chamber 130 and an O-ring groove 134 is formed enclosing the gate 17. That face of the load lock chamber 130 at which the gate 17 and the O-ring groove 134 are formed is called an O-ring seal face 135. A recessed portion 140 is formed around this O-ring seal face 135. Small recesses 142 are formed on the bottom of the recessed portion 140 at five positions thereof, for example.

An insulating member 144 made of ceramics, high in heat insulation, is fixedly attached to each of the small recesses 142. Stepped holes 146 are formed in each of the insulating members 144, so that heads of screws 148 which fix the insulating member 144 to the load lock chamber 130, passing through the stepped holes 146, can be kept not projected from the top of the insulating member 144. To add more, the tops of the insulating members 144 serve as a reference face when the load lock chamber 130 is to be connected to the process chamber 100, and this reference face is most highly projected from that face of the load lock chamber 130 which is connected to the process chamber 100.

In the case of this example where the tops of the insulating members 144 are used as the reference face, a clearance $C_1$ extending from the reference face to the O-ring seal face 135 is 0.1 mm and another clearance $C_2$ extending from the reference face to the bottom of the recessed portion 140 is 5 mm.

Bolt attaching areas 150 are formed around the recessed portion 140 and provided with plural bolt inserting holes 152. A clearance $C_3$ extending from the reference face to the bolt attaching area 150 is 1 mm.

First, second and third positioning ceramic members 154, 156 and 158 are arranged at the rim of the bolt attaching area 150. The first and second positioning ceramic members 154 and 156 are projected downward from the bottom end of the bolt attaching area 150 and the load lock chamber 130 can be positioned relative to the process chamber 100 in the vertical direction by these projected portions of the first and second positioning ceramic members 154 and 156 when the process chamber 100 is to be attached to the load lock chamber 130.

As shown in FIG. 4, the third positioning ceramic member 158 is projected right from the right end of the bolt attaching area 150 and the load lock chamber 130 can be positioned relative to the process chamber 100 in the horizontal direction by this right projected portion of the third positioning ceramic member 158.

That face 162 of the process chamber 100 which is connected and fixed to the load lock chamber 130 is on the same level as its bolt attaching area 164. A gate 166 formed in the process chamber 100 is located in opposite to the gate 17 of the load lock chamber 130. The load lock chamber 130 has a gate valve (not shown) for opening and closing the gate 17.

The connection of the load lock chamber 130 relative to the process chamber 100 is achieved using a bolt 170 and a nut 172 while interposing the O-ring 136 in the groove 134. This plasma etching system has various components including a program for etching wafers W in the process chamber 100.

In the case of the plasma etching apparatus of the RIE type according to an embodiment of the present invention, the upper frame 30 is earthed and RF current is supplied to the upper and lower susceptors 52 and 54, thereby forming electrodes opposed to each other. The permanent magnet 122 is rotated in opposite to the wafer W and above the upper frame 30 and the magnetic field is generated adjacent to the wafer W and perpendicular to the face of the wafer W, thereby causing magnetron etching process atmosphere to be formed. Etching gas is introduced into the process chamber 100, while keeping the chamber 100 vaccum, and made plasma between the opposed electrodes.

When the above-described magnetron plasma etching is to be carried out, the wafer W which as to be processed is cooled to a temperature of about $-60°$ C., for example. The cooling jacket 20 is provided for this purpose and liquid nitrogen of $-196°$ C. is used for the cooling jacket 20 to cool the wafer W. When the wafer W is to be cooled, it is quite ideal that heat exchange is conducted only between the cooling jacket 20 and the wafer W. When the heat exchange of the cooling jacket 20 with other members is reduced as small as possible, therefore, the wafer W can be cooled with high efficiency. A fine adjustment of the wafer temperature is carried out by the heater 53. When heat exchange is conducted in this manner, the lower frame 32 can be prevented from being cooled and reaction products can be thus prevented from adhering to this low temperature area of the lower frame.

An inert gas or hydrogen gas is introduced on the contact surface of the upper and lower susceptors in order to promote heat conduction therebetween.

According to this embodiment of the present invention, the first clearance 58 is formed between the outer circumferences of the upper and lower susceptors 52, 54 and the inner circumference of the insulation frame 56 and the third clearance 58 is also formed along the inner circumference of the side wall 32a of the lower frame 32. Heat transmission can be thus prevented between the upper and lower susceptors 52, 54 and the lower frame 32 or between the cooling jacket 20 and the lower frame 32.

Further, the first and third clearances 58 and 24 are sealed at their upper ends by the first and second O-rings 40 and 44 and they are formed as vacuum heat insulating layers through the second exhaust system 36. As the result, heat convection in each of the clearances 58 and 24 can be prevented by these vacuum heat insulating layers, thereby enabling more efficient heat insulating effect to be attained. This prevents reaction products from adhering to the inner circumference of the lower frame 32.

Furthermore, this embodiment of the present invention includes the second exhaust system 36 in addition to the first exhaust system 34 through which the process chamber is exhausted vacuum, and the second and third clearances 23 and 24 are exhausted vacuum via the second exhaust system 36. As the result, reaction products scattering in the process chamber can be exhausted through the second exhaust system 36, so that they can be prevented from entering into the clearances 58 and 24 and adhering to the side walls of these clearances.

Heat insulation between each of the load lock chambers 130 and the process chamber 100 will be described.

The wafer W is carried into the process chamber 100 through one of the load lock chambers 130. In order to prevent reaction products from adhering to the inner circumference of the process chamber 100, the chamber 100 is heated by the heater 31 in such a way that the temperature of its outer wall becomes about 60° C., for example, during the etching process of the wafer W.

When the chambers 100 and 130 are connected to each other, they are directly contacted with each other only through the ceramic members 144, O-ring 136 and bolt 170. Each of the ceramics members 144 has a relatively large contact area but they are made of ceramics excellent in heat insulation. Therefore, the amount of heat transmitted through the ceramic members 144 can be made quite smaller than that transmitted through metal faces. In addition, the other members have relatively small contact areas. These enable the amount of heat transmitted through the members 144, O-ring 136 and bolt 170 to be made quite small in total.

A clearance 180 never fails to exist between metal faces of the aluminum made process and load lock chambers 100 and 130 except those areas where the abovementioned contact members are located between them, thereby keeping them not contacted. Heat is therefore transmitted between them only through heat convection of air. This enables heat insulating effect to be made quite higher, as compared with the conventional case where heat was transmitted through metal faces.

When the fastening members such as the O-ring 136 and bolt 170 are excluded, the process and load lock chambers 100 and 130 are directly contacted with each other only through the heat insulating members 144 in the case of this embodiment. The material of which the non-metal heat insulating member 144 is made is not limited to ceramics, but it may be made of any of those materials which have heat insulating capacity, including non-metals. A heat insulating ring and others may be used to reduce the amount of heat transmitted through the bolt 170.

The present invention can be applied to various kinds of apparatuses wherein the process chamber is connected to the load lock chambers to carry out some processes. It should be therefore understood that the present invention is not limited to the plasma etching apparatus which has been described above as an embodiment of the present invention. The present invention can be applied to a CVD apparatus or the like.

According to the present invention as described above, heat insulating effect can be made higher between those faces of the process and load lock chambers which are connected to each other. This enables the power consumption of the heater for the process chamber to be made smaller and the temperature control of the process chamber to be made easier.

Further, the temperature of the object can be independently controlled. Furthermore, the present invention is not limited to the treatment of the semiconductor wafer, and can be applied to the treatment of LCD substrate.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A processing apparatus, comprising:
a susceptor for mounting and holding an object thereon;
a temperature control section for controlling a temperature of the susceptor, said temperature control section having a cooling section;
a process chamber having a wall which encloses said susceptor and cooling section, a part of the process chamber wall extending upward from a bottom of the process chamber to form an inner cylinder;
a clearance defined by peripheral surfaces of said susceptor and cooling section, and an inner surface of said inner cylinder;
first exhausting means for exhausting a process area surrounded by the wall of said process chamber;
second exhausting means for exhausting said clearance, so that the wall of said process chamber is heat-insulated from the susceptor and the cooling section by said clearance; and
gas supply means for supplying a process gas to said process area.

2. The apparatus according to claim 1, further comprising a heater embedded in a lower portion of the process chamber wall.

3. The apparatus according to claim 1, wherein said temperature control section includes a cooling jacket and a heater.

4. The apparatus according to claim 3, wherein the cooling jacket of said temperature control section serves to cool the object on the susceptor to a temperature lower than room temperature.

5. The apparatus according to claim 1, wherein said inner cylinder an outer circumferential surface of the susceptor and the temperature control section have a surface of high reflectivity so as to be substantially free from loss of radiation heat energy.

6. The apparatus according to claim 1, further comprising an RF power source for supplying RF current to the susceptor, and a means for grounding the process chamber wall, wherein when current is applied to the susceptor, plasma is generated between the susceptor and the process chamber wall.

7. The apparatus according to claim 6, further comprising a means for applying magnetic field to the plasma created between the susceptor and the process chamber wall.

8. The apparatus according to claim 6, further comprising an insulating member disposed between said susceptor and said temperature control section for insulating the two.

9. The apparatus according to claim 1, wherein said temperature control section is provided with a cooling jacket into which liquid nitrogen is supplied.

10. The apparatus according to claim 11, further comprising:
   shielding means for shielding an opening portion of said clearance from the process area of said process chamber.

11. The apparatus according to claim 1, further comprising:
   an insulation frame interposed between said susceptor and said cooling section.

12. The apparatus according to claim 11, wherein said susceptor and said cooling section are supported by plural insulating members on a support surface of said process chamber, and said clearance includes:
   a first clearance defined by a bottom surface of said cooling section and the support surface of said process chamber; and
   a second clearance defined by peripheral surfaces of said insulation frame and said cooling section, and an inner surface of said inner cylinder, said first and second clearances being in fluidic communication with each other.

13. A process apparatus, comprising:
   a susceptor for mounting and holding an object thereon;
   a process chamber having a wall which encloses the susceptor, a part of the process chamber wall extending upward from a bottom of the process chamber to form an inner cylinder;
   a temperature control section for controlling a temperature of the susceptor, said temperature control section having a cooling section supported by plural insulating members on a support surface of said process chamber;
   an insulation frame interposed between said susceptor and said cooling section;
   first exhausting means for exhausting gas in a process area surrounded by the wall of said process chamber;
   a first clearance defined by a bottom surface of said cooling section and the support surface of said process chamber;
   a second clearance defined by peripheral surfaces of said insulation frame and cooling section, and an inner surface of said inner cylinder, said first and second clearance being in fluidic communication with each other;
   shielding means for shielding an opening portion of said second clearance from the process area of said process chamber;
   second exhausting means for exhausting gas in said clearances, so that the wall of said process chamber is heat-insulated from the susceptor and the cooling section by said clearance; and
   gas supply means for supplying a process gas to said process area.

* * * * *